United States Patent [19]

Woosley et al.

[11] Patent Number: 5,656,549
[45] Date of Patent: Aug. 12, 1997

[54] METHOD OF PACKAGING A SEMICONDUCTOR DEVICE

[75] Inventors: Alan H. Woosley; Harold A. Downey, Jr., both of Austin; Everitt W. Mace, Hutto, all of Tex.

[73] Assignee: Motorola, Inc., Schaumburg, Ill.

[21] Appl. No.: 699,288

[22] Filed: Aug. 19, 1996

[51] Int. Cl.$^6$ ............................................. H01L 21/60
[52] U.S. Cl. ................... 438/118; 264/272.17; 438/126
[58] Field of Search ............................. 437/209, 211, 437/212, 214, 215, 216, 217, 218, 219, 220

[56] References Cited

U.S. PATENT DOCUMENTS

| | | | |
|---|---|---|---|
| 4,554,126 | 11/1985 | Sera | 437/212 |
| 4,954,308 | 9/1990 | Yabe et al. | 264/272.1 |
| 5,147,821 | 9/1992 | McShane et al. | 437/212 |
| 5,200,362 | 4/1993 | Lin et al. | 437/207 |
| 5,200,366 | 4/1993 | Yamada et al. | 437/209 |
| 5,214,846 | 6/1993 | Asami et al. | 437/211 |
| 5,237,938 | 8/1993 | Lin et al. | 437/207 |
| 5,239,198 | 8/1993 | Lin et al. | 257/693 |
| 5,304,512 | 4/1994 | Arai et al. | 437/209 |
| 5,527,743 | 6/1996 | Variot | 437/211 |
| 5,563,103 | 10/1996 | Komatsu | 437/211 |

*Primary Examiner*—Kevin Picardat
*Attorney, Agent, or Firm*—Keith E. Witek

[57] ABSTRACT

A method of packaging a semiconductor device includes providing a chase (11) with a cavity (12). The cavity (12) has a cavity sidewall (13). A substrate (19) is provided having a substrate sidewall (20) wherein the substrate (19) is positioned in the cavity (12). A space or gap (21) is formed between the substrate sidewall (20) and the cavity sidewall (13). To insulate the gap (21) from mold compound (27), a barrier layer (22) is placed adjacent to the chase (11) and adjacent to the substrate (19) wherein the barrier layer (22) overlays a portion of the space or gap (21). Mold compound (27) is injected over the barrier layer (22), over the portion of the space or gap (21), and toward the substrate (19). The barrier layer (22) is used to prohibit the mold compound (27) from contacting the substrate sidewall (20) and the cavity sidewall (13) when the substrate (19) is being encapsulated.

20 Claims, 3 Drawing Sheets

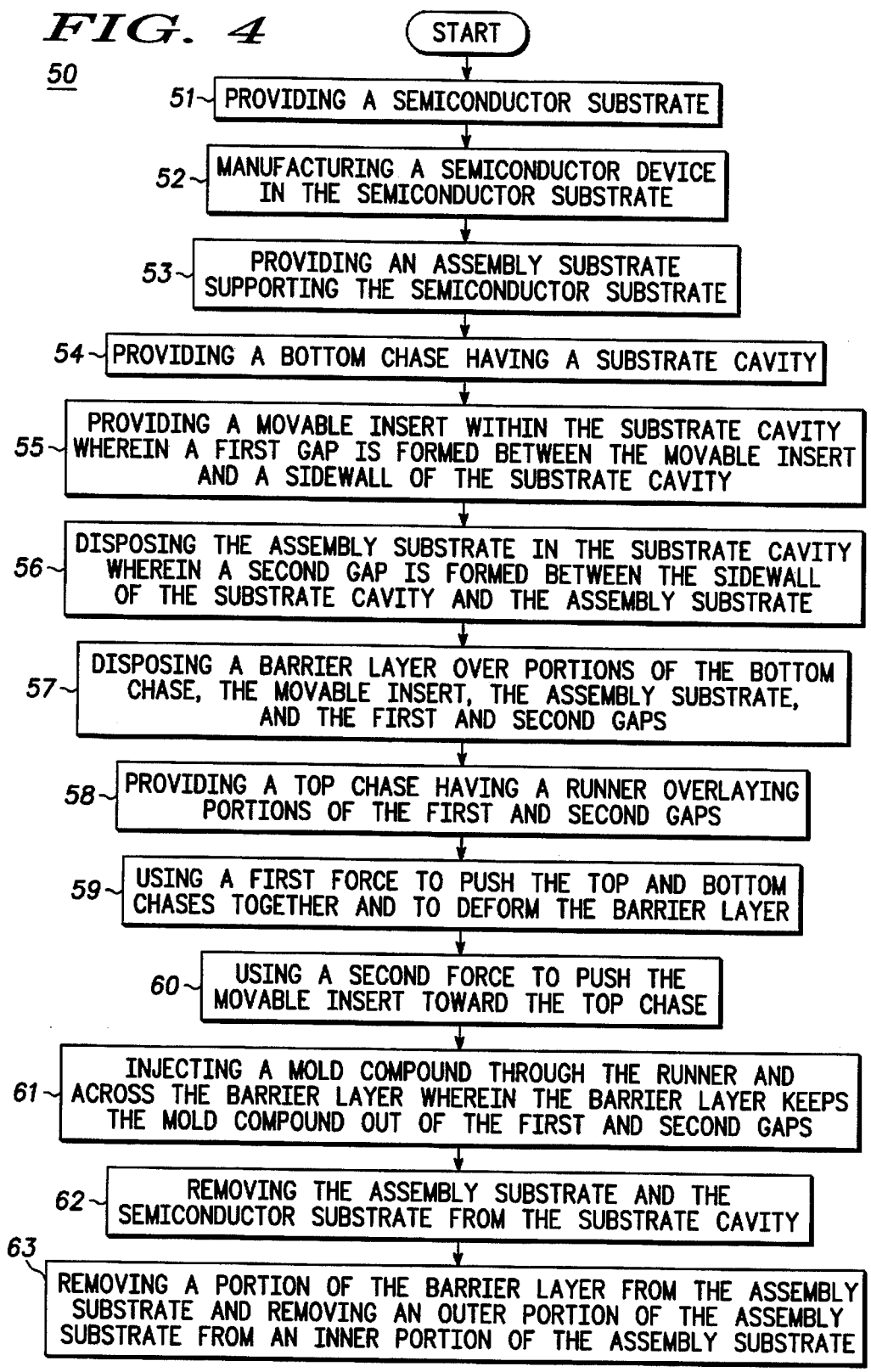

METHOD OF PACKAGING A SEMICONDUCTOR DEVICE

FIELD OF THE INVENTION

This invention relates, in general, to semiconductor devices, and more particularly, to a method of packaging semiconductor devices.

BACKGROUND OF THE INVENTION

Assembly substrates for overmolded devices such as ball grid arrays (BGAs) are highly variable in length, width, and thickness because of the imprecise and inexpensive manufacturing techniques used to create the assembly substrates. Conventional multiplunger mold presses can compensate for the thickness variation from one assembly substrate to another assembly substrate by using a movable insert in a cavity of a lower chase. However, the conventional multiplunger mold presses cannot compensate for the length or width variations of different assembly substrates. Therefore, after the assembly substrate is supported by the movable insert within the cavity of the lower chase, gaps are formed between the assembly substrate and sidewalls of the cavity. Consequently, during the molding process, a mold compound fills the gaps and often contacts the movable insert, which is located beneath the assembly substrate. After curing the mold compound, the insert is often locked in place by the hardened mold compound and is no longer movable. Consequently, the cost and cycle time for packaging a semiconductor device is increased because the lower chase must be cleaned prior to packaging another semiconductor device so that the mobility of the insert is restored and so that the insert can compensate for the different thickness of the next assembly substrate.

Accordingly, a need exists for a method of packaging semiconductor devices that is cost effective, that has an efficient cycle time, and that compensates for the variations in length and width of different assembly substrates.

BRIEF DESCRIPTION OF THE DRAWINGS

FIG. 4 is a flow chart outlining a method of packaging the semiconductor device in accordance with the present invention.

DETAILED DESCRIPTION OF THE DRAWINGS

Figure 1:
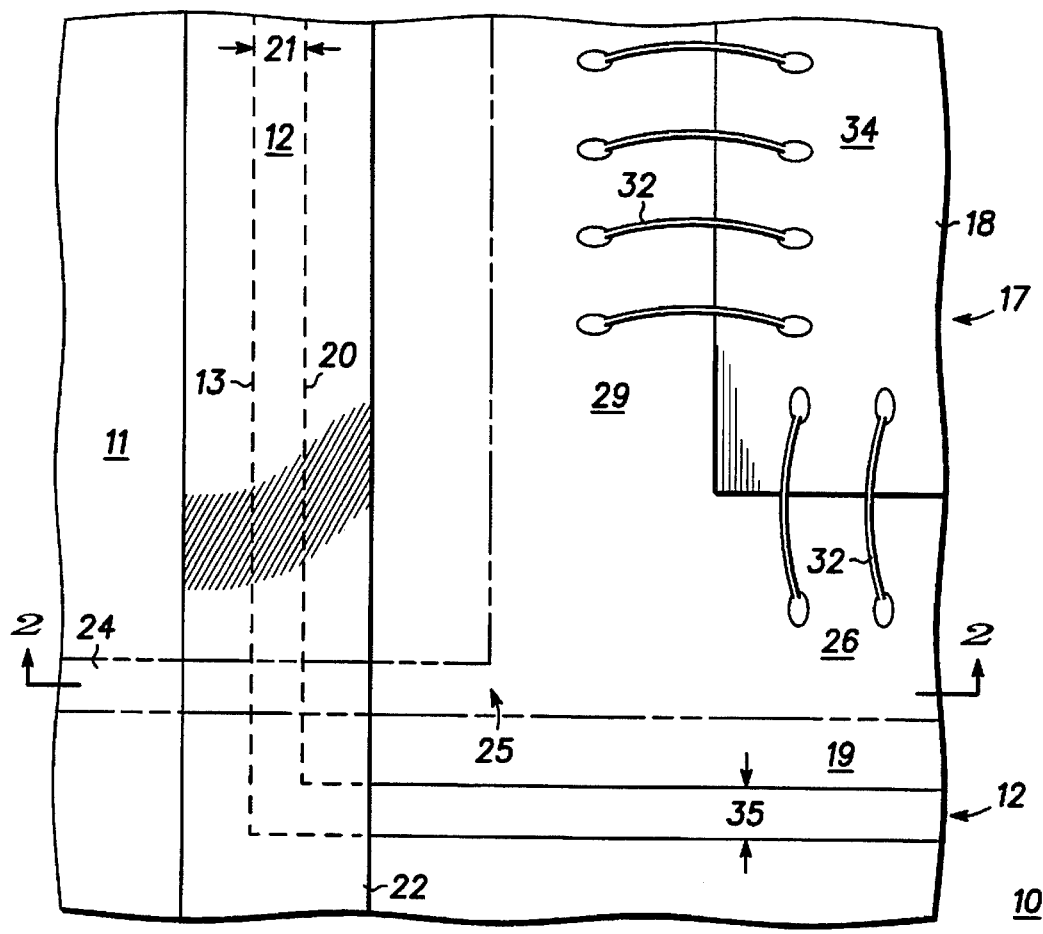
FIG. 1 illustrates a partial top-perspective view of an embodiment of a semiconductor device positioned in a mold press in accordance with the present invention.
Figure 2:
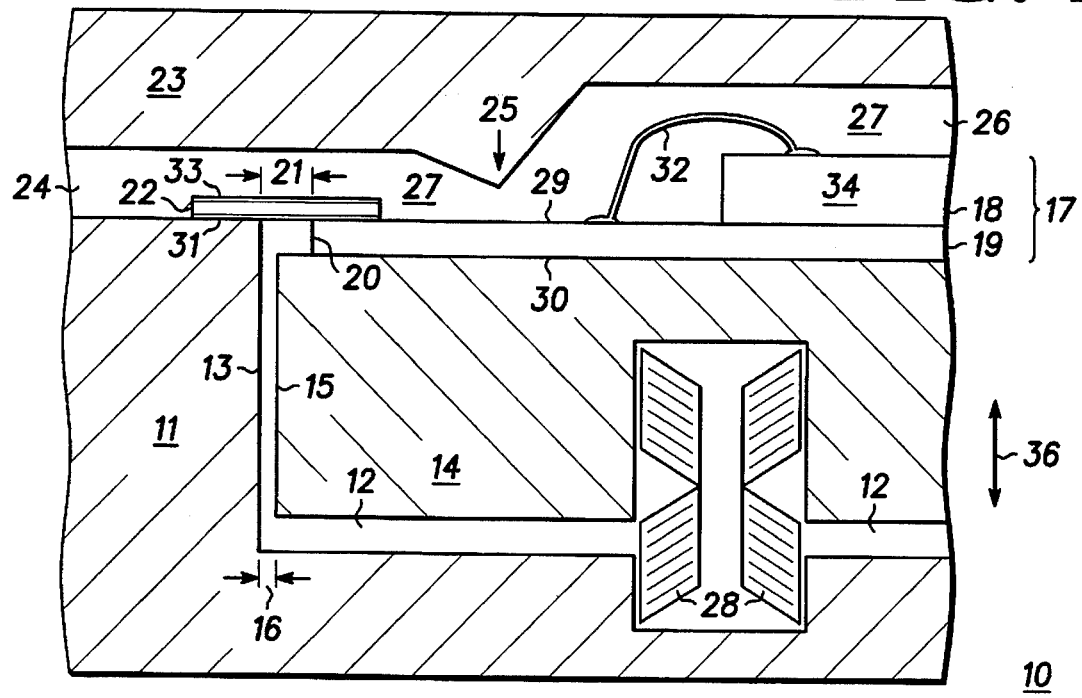
FIG. 2 portrays a partial cross-sectional view of the semiconductor device positioned in the mold press taken along a section line 2—2 in FIG. 1.

FIG. 1 illustrates a partial top view of an embodiment of a semiconductor device 17 positioned in a mold press 10, and FIG. 2 portrays a cross-sectional view of device 17 positioned in mold press 10 taken along a section line 2—2 in FIG. 1. It should be understood that the same reference numerals are used in the figures to denote the same elements. Device 17 is depicted in FIGS. 1 and 2 as an overmolded device such as, for example, a ball grid array (BGA). However, it is understood that device 17 can represent any type of electronic device that is packaged by a molding process. Device 17 includes a semiconductor substrate 18 overlying an assembly substrate 19. Substrate 18 is comprised of a semiconductor material including, but not limited to silicon, germanium, silicon on insulator (SOI), or gallium arsenide. A semiconductor transistor or integrated circuit 34 is fabricated in substrate 18 using processing techniques known to those skilled in the art. Because circuit 34 can have many different structures, the depicted structure is only for the purpose of illustrating circuit 34. Wire bonds 32 are used for electrical coupling between circuit 34 and substrate 19. It is understood that substrate 18 can alternatively be a flip chip substrate that uses flip chip bumps (not shown) instead of wire bonds 32 for electrical coupling to substrate 19.

Assembly substrate 19 can be comprised of conventional plastic ball grid array assembly substrate materials such as, for example, a fiber fabric reinforced bis-maleimide triazine (BT) epoxy resin compound. Substrate 19 can be manufactured using an industry standard circuit board manufacturing process to reduce the cost of substrate 19. However, as a result of using this process, the length, width, and thickness of substrate 19 varies from one substrate to another. Substrate 19 typically includes metal traces (not shown in FIG. 1) that are electrically coupled to substrate 18 through wire bonds 32. Substrate 19 has a top surface 29, a bottom surface 30, and a side surface or substrate sidewall 20 (see FIG. 2). Sidewall 20 physically couples, joins together, or connects surfaces 29 and 30. Surface 29 faces towards and supports substrate 18.

Mold press 10 includes a bottom mold plate or a lower chase 11 (FIGS. 1 and 2) and a top mold plate or an upper chase 23 (FIG. 2). The general attributes of chase 11 and chase 23 are known to those skilled in the art. Chase 11 includes a recess or substrate cavity 12 that has a cavity sidewall 13. A movable block or floating insert 14 is located within cavity 12, and insert 14 has an insert sidewall 15 that faces towards and is usually substantially parallel to sidewall 13. A space, crevice, or gap 16 exists between sidewalls 13 and 15. Gap 16 permits insert 14 to move within cavity 12, and gap 16 can be less than approximately fifty microns in some embodiments. A moving device 28 supports insert 14 within cavity 12. Moving device 28 enables insert 14 to move within cavity 12 along an axis 36 to compensate for the thickness variations between assembly substrates, such as substrate 19 of FIG. 2. Device 28 can be a mechanical, pneumatic, hydraulic, or other appropriate apparatus known in the art.

Device 17 is located or positioned within cavity 12 wherein surface 30 of substrate 19 faces towards or into cavity 12, wherein surface 29 of substrate 19 faces away from or out of cavity 12, and wherein sidewall 20 of substrate 19 faces towards and can be substantially parallel to sidewall 13. Insert 14 underlies and supports surface 30 of substrate 19 within cavity 12. A space, crevice, or gap 21 exists between sidewalls 13 and 20, and gap 21 overlays or is contiguous with gap 16. Another gap 35 (FIG. 1) also exists between different sidewalls of substrate 19 and cavity 12. The formation of gaps 21 and 35 is the result of the length and width variation between assembly substrates, such as substrate 19. Gaps 21 and 35 are typically different sizes, are each typically greater than approximately twenty-five microns, and are both typically larger than gap 16.

A protective layer, blocking layer, or barrier layer 22 is disposed, positioned over, or adjacent to a portion of chase 11, a portion of sidewalls 13, 15, and 20, a portion of insert 14, a portion of cavity 12, a portion of substrate 19, and a portion of gaps 16 and 21. Layer 22 serves as a bridge for an encapsulation material or mold compound 27 over gaps 16 and 21. Layer 22 protects gap 16 and 21 by preventing or blocking mold compound 27 from entering or dogging gaps 16 and 21 as described hereinafter. Layer 22 can be a disposable or temporary layer that should overlap each of chase 11 and substrate 19 by at least one millimeter to ensure that layer 22 is an effective bridge or barrier for gaps 16 and 21. Layer 22 can be provided or positioned in place by using manual labor or by using an automated film application system, as known in the art, either before or after device 17 is disposed within cavity 12. Layer 22 should remain chemically and mechanically stable during the high temperatures and pressures of the molding process. Typical clamping pressures for chases 11 and 23 range from about fifty to five hundred MegaPascals (MPa); typical mold injection pressures range from about three to fifteen MPa; and typical molding temperatures range from about one hundred fifty to one hundred ninety degrees Celsius. Mold compound 27 should not be able to penetrate through or puncture layer 22. However, layer 22 is preferably flexible or slightly deformable during the molding process in order to form a reliable seal between chase 11 and chase 23. Layer 22 can have a thickness of approximately twenty-five to one hundred twenty-five microns. Layer 22 can be comprised of a flexible polyimide material including, but not limited to, Kapton™ tape or Upilex™ tape, which are commercially available from the DuPont Corporation of Wilmington, Del. and from UBE, Incorporated of Ube City, Yamaguchi, Japan, respectively. Alternatively, layer 22 can be comprised of a metallic foil or other appropriate thin film.

Layer 22 is held in place during the molding process by a clamping force (not shown) that holds lower chase 11 and upper chase 23 together. The clamping force can be provided with an apparatus similar to moving device 28 of FIG. 2. An adhesive layer 31 (FIG. 2) is preferably used with layer 22 to assist in keeping layer 22 in proper position during the molding process. Layer 31 is adjacent to layer 22 and couples or adheres layer 22 to chase 11 and surface 29 of substrate 19. Layer 31 is preferably located across all of layer 22 to ensure adequate adhesion. However, layer 31 can alternatively be located only across a portion of layer 22. For instance, layer 31 can be located only on half of layer 22 wherein layer 31 exists between layer 22 and chase 11 and does not exists between layer 22 and substrate 19. On the other hand, layer 31 can be located only on a different half of layer 22 wherein layer 31 exists between layer 22 and substrate 19 and does not exists between layer 22 and chase 11. Layer 31 should be comprised of an adhesive material that is chemically and mechanically stable during the high temperatures and pressures of the molding process. As an example, layer 31 can be comprised of a silicone-based adhesive.

Another adhesive layer 33 (FIG. 2) can also be used with layer 22 to assist in keeping layer 22 in place during the molding process. Layer 33 is adjacent to an opposite surface of layer 22 and couples or adheres layer 22 to chase 23. Layers 31 and 33 can be used in together or separately. For instance, although not depicted in FIG. 2, a combination of layers 31 and 33 can be used to couple or adhere layer 22 to surface 30 of substrate 19 and chase 11. In this alternative embodiment, a portion of layer 22 is located between substrate 19 and insert 14. Layer 33 can be comprised of similar materials as layer 31.

Upper chase 23 is positioned over or overlays lower chase 11 and device 17. Chase 23 includes a runner 24, a gate 25, and a recess or package cavity 26 wherein gate 25 couples runner 24 and cavity 26. Cavity 26 overlays substrate 18, wire bonds 32, and portions of substrate 19, insert 14, and cavity 12. Cavity 26 should be sufficiently large to enable mold compound 27 to cover or encapsulate all of wire bonds 32 and substrate 18. Gate 25 overlays portions of substrate 19, insert 14, and cavity 12. Runner 24 overlays portions of layer 22, gaps 21 and 16, sidewalls 13, 15, and 20, substrate 19, and insert 14. Layer 22 is located underneath runner 24 to prevent mold compound 27 from leaking into gaps 21 and 16. Layer 22 should be located at least under a portion of runner 24 that overlays gap 21. Layer 22 does not have to overlay all of gap 21 and does nor have to cover the entire perimeter of cavity 12. A footprint of runner 24, gate 25, and cavity 26 is shown as a dashed line in FIG. 1.

The force that holds chase 11 and chase 23 together during the molding process is sufficiently strong to prevent mold compound 27 from leaking or escaping from the sides of runner 24, gate 25, or cavity 26. This first force should be larger than the pressure used for injecting molding compound 27, and this first force typically deforms portions of layer 22 along the sides of runner 24. A second force is provided by moving device 28 to push or compress insert 14 and device 17 towards chase 23. The second force is typically less than the first force because the second force is needed to support device 17 while the first force is needed to prevent the previously described flash formation between chase 11 and chase 23 during the molding process. The first force is not used to support device 17 because the first force can fracture, break, or crush substrate 19.

Mold compound 27 is forced, injected, or guided through runner 24, over layer 22 and gaps 21 and 16, through gate 25, into cavity 26, and toward device 17. Layer 22 keeps mold compound 27 out of gaps 21 and 16, and layer 22 prohibits mold compound 27 from contacting sidewalls 13, 15, and 20. Mold compound 27 can be a thermoset epoxy or a thermoplastic material, as known in the art. Mold compound 27 is cured or hardened in runner 24, gate 25, and cavity 26, and then, substrates 18 and 19 of device 17 are removed from cavity 12 of chase 11.

A perimeter portion of substrate 19 is removed, excised, or cut off of a central portion of substrate 19 to eliminate undesired or excess portions of substrate 19. While excising the perimeter portion of substrate 19, undesired portions of mold compound 27, such as the portion of mold compound 27 that was cured in runner 24, is also removed. Furthermore, the step of excising the perimeter portion of substrate 19 can also assist in removing layer 22 from substrate 19. In this case, layer 22 should only overlay a portion of substrate 19 that is to be removed after the molding process. Alternatively, layer 22 can be peeled off substrate 19 after the molding process wherein the peeling of layer 22 can assist in the removal of the undesired portions of mold compound 27.

Figure 3:
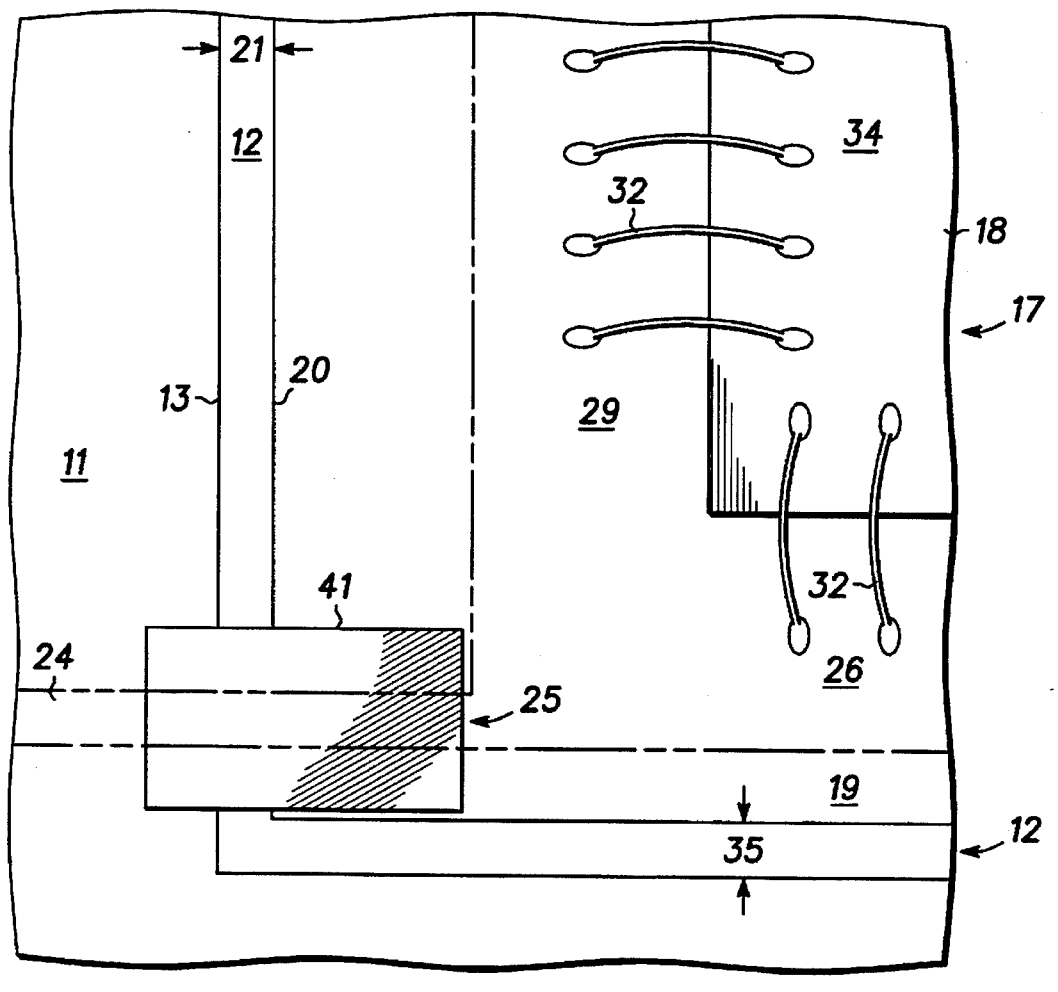
FIG. 3 depicts a partial top-perspective view of an alternative embodiment of the semiconductor device positioned in the mold press in accordance with the present invention.

FIG. 3 depicts a partial top view of an alternative embodiment of device 17 positioned in a mold press 40. It is understood that the same reference numerals are used in the figures to denote the same elements. Similar to mold press 10 of FIGS. 1 and 2, mold press 40 includes insert 14 (not shown in FIG. 3) in cavity 12 of lower chase 11 wherein insert 14 supports substrate 19. A barrier, blocking, or protective layer 41 is used in mold press 40 to prevent a mold compound from entering gaps 21 and 16. Layer 41 overlays a portion of substrate 19, a portion of chase 11, a portion of gap 21, a portion of cavity 12, and a portion of sidewalls 13 and 20. Layer 41 can be similar in composition to layer 22 of FIGS. 1 and 2. In another alternative embodiment, when a thermoset material is used to package device 17, layer 41 can be a molded piece of thermoplastic material such as polyphenylene sulfide (PPS), which is commercially available from Phillips 66 Company of Bartsville, Okla. In this other alternative embodiment, layer 41 is molded over a portion of substrate 19 prior to placing device 17 in cavity 12 of mold press 40. Regardless of its composition, layer 41 is disposed underneath all of the portion of runner 24 that overlays gap 21 and is disposed underneath all or some of gate 25. Layer 41 does not have to overlay all of gap 21 along sidewalls 13 and 20. Instead, layer 41 may only overlay a portion of gap 21 that underlies runner 24. Layer 41 should have a width that is wider or larger than a width of runner 24 to ensure adequate protection of gaps 21 and 16. A step of removing layer 41 from substrate 19 can assist in removing a portion of the cured packaging material from substrate 19 wherein the portion of the encapsulation or packaging material is cured in the regions of gate 25 and runner 24.

FIG. 4 is a flow chart 50 outlining a method of packaging device 17 or a method of manufacturing a semiconductor component, as described hereinbefore with reference to FIGS. 1, 2, and 3. A semiconductor substrate 18 is provided in a step 51 of flow chart 50, and a semiconductor device or circuit such as, for example, circuit 34, is manufactured or fabricated in the semiconductor substrate during a step 52. An assembly substrate, such as substrate 19, is provided to support the semiconductor substrate in a step 53. A bottom mold plate or chase, such as chase 11, is provided during a step 54, and a movable insert, such as insert 14, is provided in a cavity of the chase in a step 55 wherein a gap is formed between a sidewall of the insert and a sidewall of the cavity. The assembly substrate is disposed, positioned, or placed in the cavity of the chase wherein the insert supports the assembly substrate in the cavity and wherein another gap is formed between the sidewall of the cavity and a sidewall of the assembly substrate in a step 56. During a step 57, a barrier layer, such as layer 22 or layer 41, is coupled or adhered to the chase and the assembly substrate, and the barrier layer is disposed, positioned, or placed over at least a portion of the gap between the sidewalls of the cavity and the assembly substrate. A top mold plate or chase, such as chase 23, is provided overlying portions of the assembly substrate and the bottom chase in a step 58 wherein a portion of a runner in the top chase overlays a portion of the barrier layer that overlays a portion of the gaps. In steps 59 and 60, different forces are used to push the two chases together and to push the insert and the assembly substrate towards the top chase, respectively. The barrier layer is deformed as a result of applying the compressive forces in steps 59 and 60. Next, a packaging material or mold compound, such as mold compound 27, is guided, injected, or forced through the runner in the top chase, across the barrier layer, across the assembly substrate, through the gate in the top chase, and into a package cavity in the top chase to encapsulate the semiconductor substrate in a step 61 of flow chart 50.

During encapsulation of step 61, the barrier layer is used to keep the mold compound out of the aforementioned gaps and to prohibit the mold compound from contacting the sidewalls of the assembly substrate, the cavity, and the insert. After the encapsulation step, the assembly substrate and the packaged semiconductor substrate are removed from the cavity in the bottom chase in a step 62, and the barrier layer is removed from the assembly substrate in a step 63 wherein removing the barrier layer assists in removing undesired portions of the mold compound that were cured in the runner and gate regions of the top chase. The removal of the barrier layer can be accomplished by excising a perimeter or outer portion of the assembly substrate from an inner or central portion of the assembly substrate.

In the prior art, after an assembly substrate is positioned in a cavity of a lower chase, a cavity plate is inserted into the cavity to cover the entire perimeter of the cavity. The cavity plate also covers the entire perimeter of the assembly substrate and covers any gaps that may exist between the assembly substrate and the sidewalls of the cavity. The prior art cavity plate is typically comprised of the same rigid metal materials as the lower chase and is expensive to manufacture because of the tight tolerances required. This prior art mold apparatus will still leak if the cavity plate is not manufactured to precisely fit around the perimeter of the cavity because the high pressures involved in the molding process will force the mold compound into any small cracks between the cavity sidewalls and the cavity plate. The use of layers 22 or 41 in place of the prior art cavity plate reduces the cost of manufacturing or packaging a semiconductor device. It is estimated that the use of layers 22 or 41 may increase the final cost of a semiconductor device by less than approximately one penny. The use of layers 22 or 41 is also more reliable than the prior art because layers 22 and 41 can be deformed and can form a tighter seal during the packaging process compared to the prior art.

Therefore, it is apparent there has been provided an improved method of packaging a semiconductor device that overcomes the disadvantages of the prior art. A flexible barrier layer forms a reliable seal between two mold plates and prevents a mold compound from obstructing the movement of a movable insert that compensates for thickness variations in different assembly substrates. The barrier layer compensates for the length or width variations in different assembly substrates. The use of the barrier layer improves the cycle time for packaging or manufacturing a semiconductor device by reducing the necessity for cleaning the mold plates. The use of the barrier layer eliminates the need for expensive assembly substrates that have very precise lengths and widths. The barrier layer described herein is an inexpensive solution to problems in the prior art.

While the invention has been particularly shown and described with reference to preferred embodiments, it will be understood by those skilled in the art that changes in form and detail may be made without departing from the spirit and scope of the invention. For instance, the numerous details set forth herein, such as, for example, the specific compositions of layers 22 and 41, are provided to facilitate the understanding of the present invention and are not provided to limit the scope of the invention. Furthermore, the use of layers 22 or 41 can be applied to molding non-overmolded devices. Additionally, the use of layers 22 or 41 can be applied to other types of mold apparati such as those that position device 17 with substrate 18 beneath substrate 19. Moreover, layers 22 or 41 can be deformed into gap 21 or can fill gap 21 entirely, and layers 22 and 41 can be provided on assembly substrate 19 by a vendor, which can sell the assembly substrate and the barrier layer as a single component. Accordingly, the disclosure of the present invention is not intended to be limiting. Instead, the disclosure of the present invention is intended to be illustrative of the scope of the invention, which is set forth in the following claims.

We claim:

1. A method of packaging a semiconductor device comprising:
   providing a first mold plate having a cavity, the cavity having a cavity sidewall;
   providing a substrate having a substrate sidewall;
   disposing the substrate in the cavity, the substrate sidewall facing the cavity sidewall wherein a space exists between the substrate sidewall and the cavity sidewall;
   providing a barrier layer adjacent to the first mold plate and adjacent to the substrate, the barrier layer overlying a portion of the space;

guiding a mold compound over the barrier layer, over the portion of the space, and toward the substrate; and using the barrier layer to prohibit the mold compound from contacting the substrate sidewall and the cavity sidewall.

2. The method of claim 1 wherein the step of providing the substrate includes providing the substrate with a first surface and a second surface wherein the first and second surfaces are coupled together by the substrate sidewall and wherein the step of disposing the substrate in the cavity includes facing the first surface toward the cavity and facing the second surface away from the cavity and wherein the step of providing the barrier layer includes adhering the barrier layer to the second surface of the substrate.

3. The method of claim 1 wherein the step of providing the substrate includes providing the substrate with a first surface and a second surface wherein the first and second surfaces are coupled together by the substrate sidewall and wherein the step of disposing the substrate in the cavity includes facing the first surface into the cavity and facing the second surface out of the cavity and wherein the step of providing the barrier layer includes adhering the barrier layer to the first surface of the substrate.

4. The method of claim 1 further comprising providing a second mold plate, the second mold plate overlying the first mold plate wherein the step of disposing the barrier layer includes adhering the barrier layer to the second mold plate.

5. The method of claim 1 wherein the step of providing the barrier layer includes providing a polyimide material for the barrier layer.

6. The method of claim 1 further comprising providing an adhesive layer adjacent to the barrier layer wherein the adhesive layer is comprised of silicone.

7. The method of claim 1 wherein the step of providing the barrier layer includes providing an adhesive layer between the barrier layer and the first mold plate.

8. The method of claim 1 wherein the step of providing the barrier layer includes providing an adhesive layer between the barrier layer and the substrate.

9. The method of claim 1 wherein the step of providing the barrier layer includes using the barrier layer to overlap the first mold plate by at least one millimeter.

10. A method of manufacturing a semiconductor component comprising:

providing a substrate;

providing a first mold plate having a substrate cavity;

providing a second mold plate having a package cavity;

disposing the substrate in the substrate cavity to form a gap in the substrate cavity;

disposing a blocking layer adjacent to a portion of the gap;

positioning the second mold plate over a portion of the first mold plate, the package cavity overlying a portion of the substrate; and forcing an encapsulation material into the package cavity wherein the blocking layer keeps the encapsulation material out of the gap.

11. The method of claim 10 wherein the step of providing the second mold plate includes providing a runner and a gate in the second mold plate, the gate coupling the runner and the package cavity, the gate overlying a first portion of the substrate, a portion of the runner overlying a second portion of the substrate and wherein the step of disposing the blocking layer includes disposing the blocking layer underneath the gate and underneath the portion of the runner.

12. The method of claim 11 wherein the step of disposing the blocking layer includes disposing the blocking layer underneath all of the gate and underneath all of the portion of the runner.

13. The method of claim 11 wherein the step of disposing the blocking layer includes adhering the blocking layer to the substrate and wherein the step of forcing the encapsulation material includes forcing the encapsulation material through the runner, through the gate, and into the package cavity, and further comprising:

curing the encapsulation material in the runner, in the gate, and in the package cavity; and removing the blocking layer from the substrate wherein the step of removing the blocking layer includes removing a portion of the encapsulation material from the substrate wherein the portion of the encapsulation material is cured in the gate.

14. The method of claim 10 wherein the step of positioning the second mold plate includes deforming the blocking layer.

15. A method of manufacturing a semiconductor component, the method comprising the steps of:

providing a lower chase having a substrate cavity, the substrate cavity having a sidewall;

providing an insert within the substrate cavity, the insert movable within the substrate cavity, a first gap between the insert and the sidewall of the substrate cavity;

providing a semiconductor substrate;

manufacturing a semiconductor device in the semiconductor substrate;

providing an assembly substrate supporting the semiconductor substrate, the assembly substrate supported by the insert, the assembly substrate located in the substrate cavity wherein a second gap exists between the assembly substrate and the sidewall of the substrate cavity, the second gap coupled to the first gap;

disposing a protective layer over a portion of the lower chase, a portion of the assembly substrate, and a portion of the second gap;

providing an upper chase overlying the lower chase, the upper chase having a runner and a package cavity, the runner overlying portions of the protective layer and the second gap, the runner coupled to the package cavity, the package cavity overlying the semiconductor substrate;

injecting a mold compound through the runner and into the package cavity wherein the protective layer prevents the mold compound from entering the first gap; and removing the assembly substrate and the semiconductor substrate from the substrate cavity.

16. The method of claim 15 wherein the step of disposing the protective layer includes providing a polyimide material for the protective layer.

17. The method of claim 15 wherein the step of disposing the protective layer includes molding a thermoplastic material over the portion of the assembly substrate and wherein the step of injecting the mold compound includes providing a thermoset material for the mold compound.

18. The method of claim 15 further comprising:

using a first force to push the upper and lower chases together; and using a second force to push the insert towards the upper chase wherein the first force is greater than the second force and wherein the step of using the first force includes deforming the protective layer.

19. The method of claim 15 wherein the step of disposing the protective layer includes providing a width for the protective layer and wherein step of providing the upper chase includes providing a width for the runner wherein the width of the protective layer is wider than the width of the runner.

20. The method of claim 15 further comprising removing a portion of the assembly substrate from the semiconductor component wherein the step of removing the portion of the assembly substrate includes removing the protective layer from the semiconductor component.

* * * * *